United States Patent [19]

Lewis, Jr.

[11] 4,143,366

[45] Mar. 6, 1979

[54] ANALOG-TO-DIGITAL CONVERTER

[75] Inventor: Henry G. Lewis, Jr., Princeton Junction, N.J.

[73] Assignee: RCA Corporation, New York, N.Y.

[21] Appl. No.: 780,331

[22] Filed: Mar. 23, 1977

[51] Int. Cl.² .......................................... H03K 13/175
[52] U.S. Cl. ........................................... 340/347 AD
[58] Field of Search ..................... 340/347 M, 347 AD

[56] References Cited

U.S. PATENT DOCUMENTS

| 3,737,894 | 6/1973 | Poretti | 340/347 AD |
| 3,798,637 | 3/1974 | Fruhauf | 340/347 AD |
| 3,935,569 | 1/1976 | Marcel | 340/347 AD |
| 4,008,468 | 2/1977 | Imhoff | 340/347 AD |

Primary Examiner—Charles D. Miller

Attorney, Agent, or Firm—H. Christoffersen; Samuel Cohen; Carl V. Olson

[57] ABSTRACT

An analog-to-digital (A/D) converter which is capable of encoding each one of analog signal samples occurring at a high rate, such as 40 MHz (25 ns spacing), to eight digital output bits representing any one of 256 levels. Sixteen sixteen-level A/D converter sub-units each providing four binary output bits are connected in series across analog signal input terminals. A priority encoder and a multiplexer are responsive to the carry outputs of the A/D sub-units to produce four high-order digital output bits representing the rank of the sub-unit having a voltage range encompassing the voltage of an analog input signal. Gating means responsive to the four high-order output bits pass four low-order digital output bits from the one of the sixteen sub-units identified by the four high-order bits.

1 Claim, 4 Drawing Figures

ANALOG-TO-DIGITAL CONVERTER

Very high speed analog-to-digital (A/D) converters are needed, for example, for translating samples of real-time television analog input signals, representing individual successive picture elements, to corresponding digital output signals each consisting of, say, eight binary digits (bits) representing any one of 256 analog levels. Digitized television signals lend themselves especially well to amplification in the presence of noise. They also are suitable for regeneration, manipulation and transmission in paths extending from the TV camera and perhaps via a satellite to a TV station from which an analog TV signal is broadcast to receivers in homes. High speed A/D converters are also needed in digital radar systems.

A high speed A/D converter according to an example of the invention includes a plurality of A/D converter sub-units having analog signal inputs connected in series. When an analog signal is applied across the series-connected A/D sub-units, means responsive to the carry outputs of the sub-units produces high-order output bits which identify one sub-unit. Gating means gate low-order output bits from the identified sub-unit.

Figure 1:
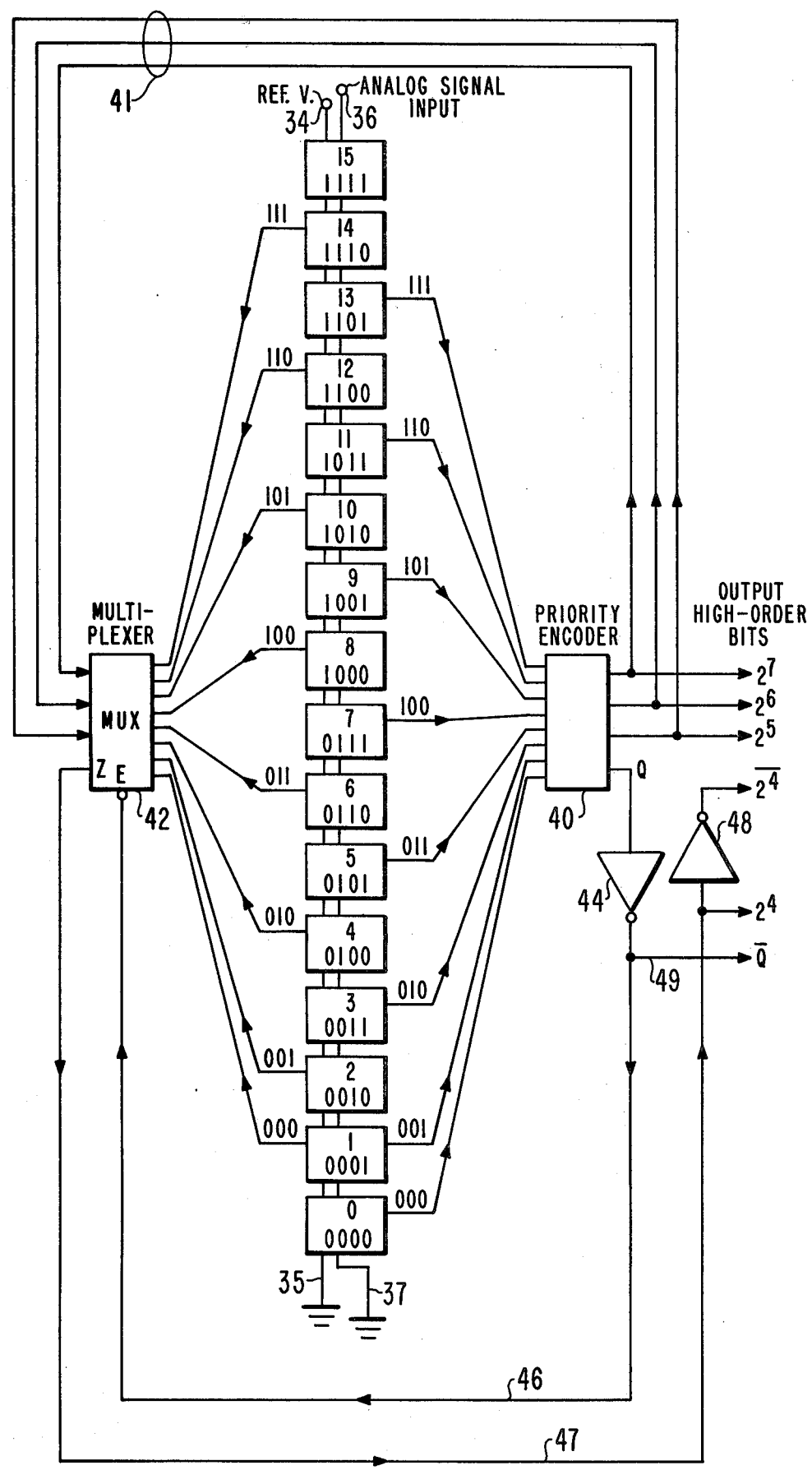
FIG. 1 is a diagram of that portion of an A/D converter, constructed according to the teachings of the invention, by which the high-order digital output bits are produced.
Figures 3, 4:
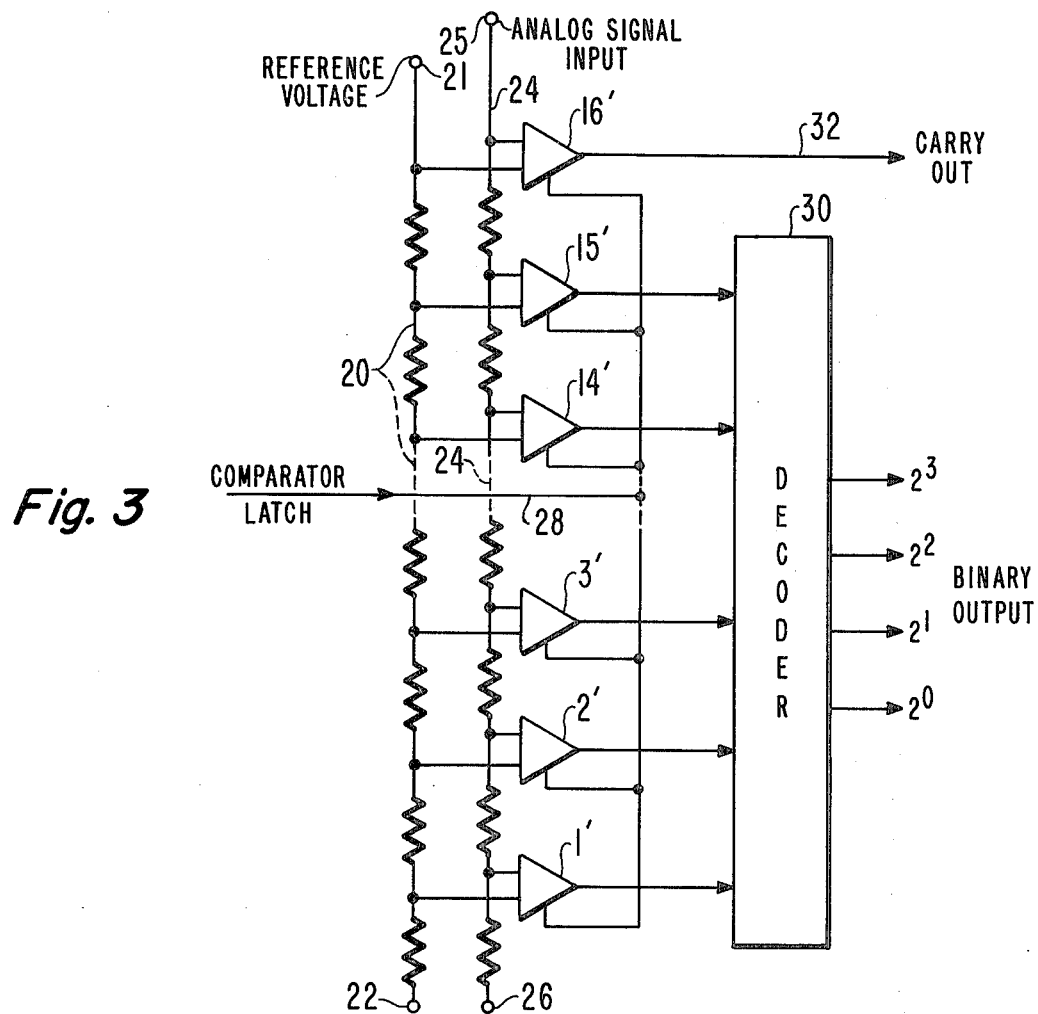
FIG. 3 is a diagram of an A/D converter sub-unit useful in the converter of FIGS. 1 and 2.
FIG. 4 is a chart giving the truth tables of two units in FIG. 1.

In FIG. 1 there are sixteen A/D converter sub-units labelled zero through 15, and, in binary numbers, 0000 through 1111. Each sub-unit may be constructed as shown in FIG. 3 to include sixteen comparators $1'$ through $16'$. Each comparator has one input connected to a reference voltage divider 20 connected between reference voltage terminals 21 and 22, and has another input connected to an analog input signal voltage divider 24 connected between analog signal input terminals 25 and 26. All comparators have latch inputs energized from a latch input line 28. The outputs of the sixteen comparators are connected to a decoder 30 providing a four-bit signal output representing the number of the highest ranking one of the first fifteen comparators which has an analog signal input equalling or exceeding the reference voltage applied to it. The sixteenth comparator provides a carry output at 32 when the analog signal input equals or exceeds the reference voltage.

The A/D converter sub-unit of FIG. 3 may be an integrated circuit unit known as the Motorola MC10331 analog-to-digital converter.

The sixteen A/D converter sub-units 0 through 15 in FIG. 1 have their reference voltage dividers connected in series across reference voltage terminals 34 and 35, and have their analog input signal voltage dividers connected in series across analog input signal terminals 36 and 37. The carry outputs of A/D sub-units numbered 0, 1, 3, 5, 7, 9, 11 and 13 (herein described as "alternate" sub-units) are connected to eight respective inputs of a priority encoder 40 which may be a standard integrated circuit unit such as the Motorola 8-input priority encoder type MC10165, having a truth table as shown in FIG. 4. The eight inputs of the priority encoder 40 are labelled with binary numbers 000 through 111. The three binary outputs lines from the priority encoder are labelled $2^7$, $2^6$ and $2^5$ because they provide the three highest-order bits of the eight bits of the digital output from the A/D converter system.

The priority encoder 40 produces a coded output representing the binary number of the highest-ranking one of its inputs which receives a carry output from a A/D converter sub-unit. Note that the binary number of each input to the priority encoder corresponds with the three most-significant bits of the two A/D converter sub-units of next higher ranks than the A/D converter sub-unit to which the input is connected, except in the case of the 000 input.

The three output bits labelled $2^7$, $2^6$ and $2^5$ from the priority encoder 40 are transmitted over lines 41 as address inputs of a multiplexer (MUX) 42 which may be a standard integrated circuit unit such as the Motorola 8-line multiplexer type MC10164 having a truth table as shown in FIG. 4. The eight signal input lines to multiplexer 42 are given binary number 000 through 111 and they are connected to carry outputs of A/D converter sub-units numbered 1, 2, 4, 6, 8, 10, 12 and 14. (These sub-units are herein called "intermediate" sub-units, although sub-unit 1 does not exactly fit the term). Note that the binary numbers of the multiplexer input lines correspond with the three most significant bits of the binary numbers of the A/D converter sub-units to which they are connected.

The priority encoder 40 has, in addition to the outputs $2^7$, $2^6$ and $2^5$, an output Q which is normally 1 and which after inversion to a 0 in inverter 44 is applied over line 46 to the enable input E of multiplexer 42. When all eight of the inputs to the priority encoder 40 are 0's, the Q output is a 0, which after inversion to $\overline{Q}$ in inverter 44 is a 1 applied over line 46 to inhibit the enable input E of multiplexer 42. This 1 input at E causes a 0 output at Z, which is applied over line 47 as the $2^4$ digital output bit of the A/D converter system, and after inversion in an inverter 48 as a signal $\overline{2^4}$ used in FIG. 2. The $\overline{Q}$ output from inverter 44 is also applied over line 49 to gates in FIG. 2.

Figure 2:
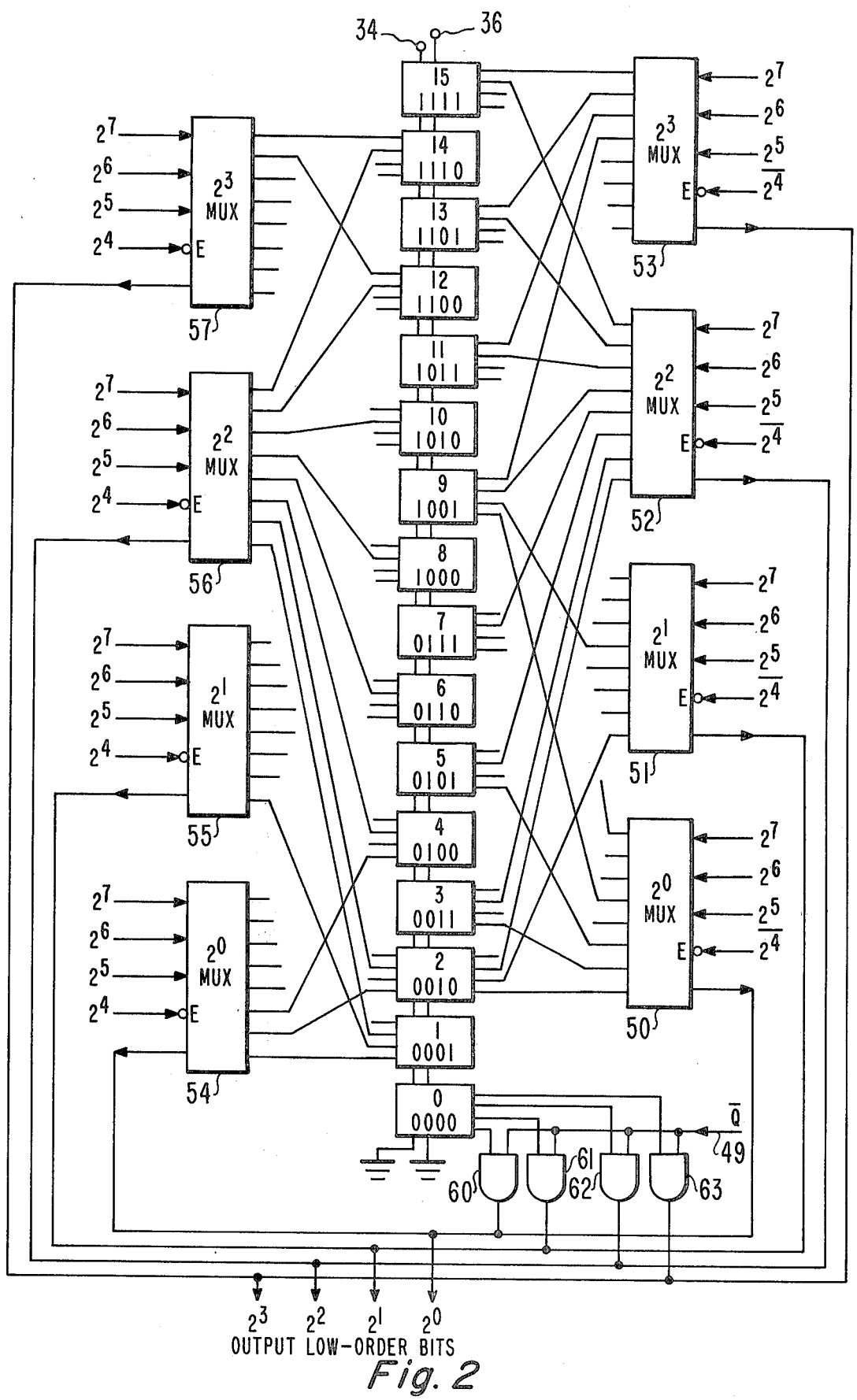
FIG. 2 is a diagram of that portion of the A/D converter by which the low-order digital output bits are produced.

FIG. 2 shows the same sixteen A/D converter sub-units 0 through 15 that are shown in FIG. 1. The sub-units are shown in FIG. 2 with solely their $2^0$, $2^1$, $2^2$ and $2^3$ outputs and connections thereto, while the sub-units are shown in FIG. 1 with solely their carry outputs and connections thereto. In FIG. 2, eight sub-units numbered 2, 3, 5, 7, 9, 11, 13 and 15 have their outputs connected to signal inputs of four eight-line multiplexers 50, 51, 52 and 53. Eight sub-units numbered 1, 2, 4, 6, 8, 10, 12 and 14 have their outputs connected to inputs of four eight-line multiplexers 54, 55, 56 and 57.

The eight input lines of multiplexer 50 are connected to $2^0$ outputs of the eight sub-units 2,3,5,7,9,11,13 and 15, respectively. The eight input lines of each of multiplexers 51, 52 and 53 are similarly connected to $2^1$, $2^2$ and $2^3$ outputs, respectively, of the eight listed sub-units. In a similar manner, the eight input lines of multiplexers 54, 55, 56 and 57 are connected to $2^0$, $2^1$, $2^2$, and $2^3$ outputs, respectively, of eight sub-units 1, 2, 4, 6, 8, 10, 12 and 14. Some connecting lines are omitted from the drawing to avoid confusion.

All of multiplexers 50 through 57 have address inputs receptive to high-order output bits $2^7$, $2^6$ and $2^5$ from the priority encoder 40 in FIG. 1. The multiplexers 50, 51, 52 and 53 are enabled at inputs E by a $\overline{2^4}$ signal equal to 0 from FIG. 1, and the multiplexers 54, 55, 56 and 57 are enabled at inputs E by a $2^4$ signal equal to 0 from FIG. 1. By this arrangement, $2^3$, $2^2$, $2^1$ and $2^0$ low-order outputs are provided at any one time from multiplexers 50, 51, 52 and 53 or from multiplexers 54, 55, 56 and 57. Under a third condition $2^3, 2^2, 2^1$, and $2^0$ low-order output bits are coupled from sub-unit 0 to the output terminals through "and" gates 60, 61, 62 and 63 when the gates are enabled by a $\overline{Q}$ signal equal to 1 from FIG. 1. When a $\overline{Q}$ signal equal to 1 is thus present on line 46 in FIG. 1, there are no $2^3, 2^2, 2^1$ and $2^0$ outputs from multiplexers 50 through 57.

In the operation of the analog-to-digital converter, a sample-and-hold circuit (not shown) samples the input analog signal and couples the analog sample across the analog signal input terminals 36 and 37 in FIG. 1. The voltage amplitude of the analog sample is compared in the sixteen A/D converter sub-units 0 through 15 with the reference voltage applied across terminals 34 and 35. If, for example, the analog voltage sample is greater than the highest voltage of the sub-range of analog voltages sensed by A/D converter sub-unit 7 and not greater than the highest voltage in the sub-range of analog voltages sensed by sub-unit 9, then unit 7 produces a carry output which is applied to the binary 100 input of priority encoder 40. The encoder 40 produces corresponding high-order output bits 100 at output bit positions $2^7$, $2^6$ and $2^5$, which are also applied as address bits to multiplexer 42.

The multiplexer 42 then passes the carry output signal of A/D converter sub-unit 8 over line 47 to the $2^4$ intermediate-order bit output line. If the analog input signal falls within the sub-range of sub-unit 8, there will be no carry output from sub-unit 8, and a binary 0 will be passed through multiplexer 42 as the $2^4$ output of the A/D converter system. On the other hand, if the analog input signal falls within the sub-range of sub-unit 9, there will be a carry output from sub-unit 8 and a binary 1 will be passed through multiplexer 42 as the $2^4$ output of the A/D converter system. Assuming that the analog input signal falls within the range of sub-unit 9, the high-order output bits $2^7, 2^6, 2^5$ and $2^4$ from the A/D converter system will be 1001. The high-order output bits always correspond with the binary numbers 0000 through 1111 of the sixteen A/D converter sub-units.

FIG. 2 shows the circuits for obtaining the four low-order bits of the digital output from the A/D converter system. The high-order bits $2^7$, $2^6$ and $2^5$ from FIG. 1 are applied as addresses to the multiplexers 50 through 57. If the multiplexer receiving an address is enabled, it passes to its output lead the signal present on the addressed one of its eight inputs. The four multiplexers 50-53 also receive the high order bit $\overline{2^4}$ from FIG. 1, and the remaining four multiplexers receive the high-order bit $2^4$ from FIG. 1, to control the enabled or disabled states of the multiplexers. Binary 0 in this position is an enabling signal, binary 1 is not. In the present example, the high-order bits 1001 cause the four multiplexers 50, 51, 52 and 53 to pass the $2^3$, $2^2$, $2^1$ and $2^0$ bits, respectively, to the output low-order bit terminals from the A/D converter sub-unit 9. These four multiplexers are enabled because $\overline{2^4} = 0$. The other four multiplexers 54, 55, 56 and 57 remain disabled because $2^4 = 1$.

In the example given, the high-order output bits from FIG. 1 are 1001, and the low-order output bits from FIG. 2 are bits corresponding with one of the sixteen values between 0000 and 1111 depending on where the input analog voltage falls in the sub-range of A/D converter sub-unit 9. The high-order bits 1001 identify sub-unit 9, and cause four low order bits to be "gated" from the outputs of sub-unit 9.

In the case when the signal applied to the analog input terminals 36 and 37 in FIG. 1 falls within the sub-range of A/D converter sub-unit 0, the priority encoder 40 and multiplexer 42 produce output high-order bits 0000 for the $2^2$, $2^6$, $2^5$ and $2^4$ bit positions, and the priority encoder 40 also produces a 0 output at Q which, after inversion at 44 to a 1, fails to enable multiplexer 42, and acts over line 49 to enable gates 60, 61, 62 and 63 to pass the four low-order bits from A/D converter sub-unit 0 to the output low-order bit terminals $2^3$, $2^2$, $2^1$ and $2^0$.

While the invention has been illustrated and described as an analog-to-digital converter for converting an analog signal to any one of 256 digital levels represented by binary numbers 0000,0000 through 1111,1111, it will be understood that the invention is not limited thereto and may be readily implemented in systems providing smaller or larger numbers of digital levels.

What is claimed is:

1. An analog-to-digital (A/D) converter, comprising analog signal input terminals, a plurality of A/D converter sub-units having analog inputs connected in series across said analog signal input terminals, each sub-units having outputs for bits representing a sub-range of analog voltages, and having a carry output for a carry signal representing an analog voltage exceeding the sub-range of the sub-unit, a priority encoder having inputs connected to carry outputs of "alternate" ones of said A/D converter sub-units, and having outputs providing all but the lowest-order one of said a multiplexer having inputs connected to carry outputs of "intermediate" ones of said A/D converter sub-units, and having an address input receptive to the output bits from said priority encoder, and having an output for the one of the inputs passed by the address input, the output providing the lowest-order one of said high-order output bits, and a plurality of multiplexers each having an address input receptive to said high-order output bits, and having inputs connected to the binary signal outputs of said A/D converter sub-units in a pattern so that output bits from the addressed one of said A/D converter sub-units are provided by a corresponding number of said multiplexers, the output bits constituting the low-order output bits of the A/D converter.

* * * * *

UNITED STATES PATENT AND TRADEMARK OFFICE
CERTIFICATE OF CORRECTION

PATENT NO. : 4,143,366

DATED : March 6, 1979

INVENTOR(S) : Henry Garton Lewis, Jr.

It is certified that error appears in the above-identified patent and that said Letters Patent is hereby corrected as shown below:

Column 4, line 17 "$2^2$" should be ---$2^7$---

Column 4, line 44 after "said" insert ---high-order output bits,---

Signed and Sealed this

Twenty-ninth Day of May 1979

[SEAL]

Attest:

RUTH C. MASON
*Attesting Officer*

DONALD W. BANNER
*Commissioner of Patents and Trademarks*